US 8,139,395 B2

(12) United States Patent
Kotaki et al.

(10) Patent No.: US 8,139,395 B2
(45) Date of Patent: Mar. 20, 2012

(54) SEMICONDUCTOR MEMORY DEVICE (75) Inventors: Hiroshi Kotaki, Osaka (JP); Yoshiji Ohta, Osaka (JP); Syuji Wakaiki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 170 days.

(21) Appl. No.: 12/777,353

(22) Filed: May 11, 2010

(65) Prior Publication Data

US 2010/0296330 A1 Nov. 25, 2010

(30) Foreign Application Priority Data

May 19, 2009 (JP) ................................. 2009-120531

(51) Int. Cl.
*G11C 11/00* (2006.01)
(52) U.S. Cl. .......................... 365/148; 365/158; 365/163
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| | | |
|---|---|---|
| 2002/0057593 A1 | 5/2002 | Hidaka |
| 2003/0117831 A1 | 6/2003 | Hush |
| 2004/0130939 A1 | 7/2004 | Morikawa |
| 2005/0122768 A1 | 6/2005 | Fukumoto |
| 2007/0091670 A1 | 4/2007 | Hidaka |
| 2007/0206406 A1* | 9/2007 | Ueda et al. ...................... 365/158 |
| 2007/0279963 A1* | 12/2007 | Tsuchida et al. ............... 365/148 |
| 2008/0049487 A1 | 2/2008 | Yoshimura et al. |
| 2009/0250735 A1* | 10/2009 | Asao .............................. 257/295 |
| 2010/0103718 A1* | 4/2010 | Asao et al. ..................... 365/148 |

FOREIGN PATENT DOCUMENTS

| | | |
|---|---|---|
| JP | 2002-151661 A | 5/2002 |
| JP | 2004-185755 A | 7/2004 |
| JP | 2005-92912 A | 4/2005 |
| JP | 2005-514719 A | 5/2005 |
| JP | 2008-52781 A | 3/2008 |

* cited by examiner

*Primary Examiner* — Richard Elms
*Assistant Examiner* — Harry W Byrne
(74) *Attorney, Agent, or Firm* — Birch, Stewart, Kolasch & Birch, LLP (57) ABSTRACT

There is provided a semiconductor memory device capable of suppressing writing disturbances without increasing the cell array area. A semiconductor memory device has a memory cell array where a number of memory cells having a two-terminal type memory element and a transistor for selection connected in series are aligned in a matrix shape, a first voltage applying circuit for applying a writing voltage pulse to a first bit line, and a second voltage applying circuit for applying a pre-charge voltage to a first and second bit line, such that at the time of the writing of a memory cell, the first voltage applying circuit pre-charges the two ends of the memory cell to the same voltage in advance, and after that, the second voltage applying circuit applies a writing voltage pulse via the first bit line directly connected to the transistor for selection.

15 Claims, 10 Drawing Sheets

Fig. 10
Prior Art ated to as setting (programming), through which the current flowing through the memory cell increases, and the operation for raising the resistance of the variable resistive element is referred to as resetting (erasing), through which the current flowing through the memory cell is made small. The definition of setting and resetting may, of course, be the opposite. In addition, combined operation of setting and resetting is referred to as writing.

SEMICONDUCTOR MEMORY DEVICE

CROSS REFERENCE TO RELATED APPLICATION

This Nonprovisional application claims priority under 35 U.S.C. §119(a) on Patent Application No. 2009-120531 filed in Japan on 19 May, 2009 the entire contents of which are hereby incorporated by reference.

BACKGROUND OF THE INVENTION

1. Field of the Invention

The present invention relates to a semiconductor memory device, and in particular to a semiconductor memory device that writes information stored based on the resistance state of a variable resistive element in memory cells by applying a voltage pulse.

2. Description of the Related Art

In recent years new types of nonvolatile semiconductor memory devices for replacing flash memories have been widely researched. In particular, RRAM's using the change in the resistance when a voltage is applied to a variable resistive film, such as of a transition metal oxide, have an advantage in that there are less limitations in terms of how much they can be miniaturized in comparison with flash memories, and make it possible to write data at a high speed, and thus, research and development are being actively carried out.

As shown in Japanese Unexamined Patent Publication 2002-151661, the conventional structure of memory cell arrays using RRAM's is of a 1T1R type, which can prevent a leak current and a roundabout current from flowing through unselected memory cells when information stored in the variable resistive element in the selected memory cell is written and read out by connecting a transistor for selecting a cell to the variable resistive element of the memory cells in series.

Figure 8:
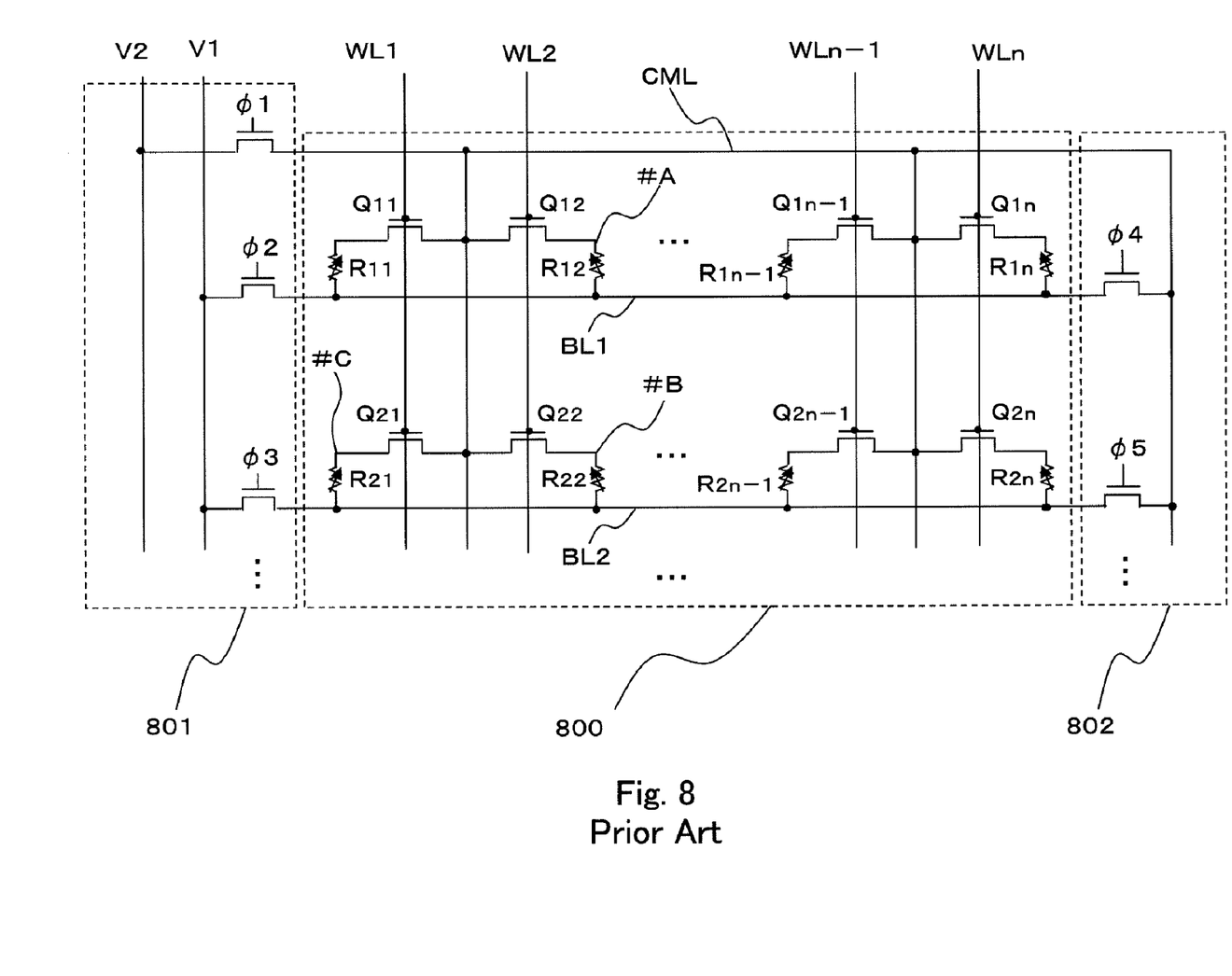
FIG. 8 is a diagram showing the circuit structure of a conventional semiconductor memory device.

FIG. 8 shows the configuration of the cell array of conventional RRAM's. In the memory cell array 800, variable resistive elements R11 to R1$n$, R21 to R2$n$ and so on, and transistors for selecting a cell Q11 to Q1$n$, Q21 to Q2$n$ and so on are aligned in a matrix shape in the column direction (lateral direction in the figure) and the row direction (longitudinal direction in the figure). In each memory cell, a first end of the variable resistive element and a first end of the transistor are connected, a second end of the variable resistive element of memory cells aligned in the same column is connected to a bit line BL1, BL2 and so on, which run in the column direction, a second end of the transistor of memory cells aligned in the same row is connected to the common line CML, which is shared by all the memory cells, and word lines WL1 to WL$n$, which run in the row direction, are respectively connected to the gate terminals of the transistors in the memory cells aligned in the same row.

External power supply lines V1 and V2 for supplying a writing voltage are connected so that the voltage in the power supply line V1 and the voltage in the power supply line V2 are applied to the bit lines BL1, BL2 and so on, and the common line CML, respectively, via the transistors in the writing voltage applying circuit 801. In addition, bit lines BL1, BL2 and so on, and the common line CML are connected via the transistors in the initialization circuit 802, and the voltage is applied to the bit lines from the common line, so that it is possible to initialize the voltage of bit lines that become of a previous writing operation voltage state due to the effects of the parasitic capacitance between wires, for example between bit lines and variable resistive elements connected to the bit lines.

Figure 9:
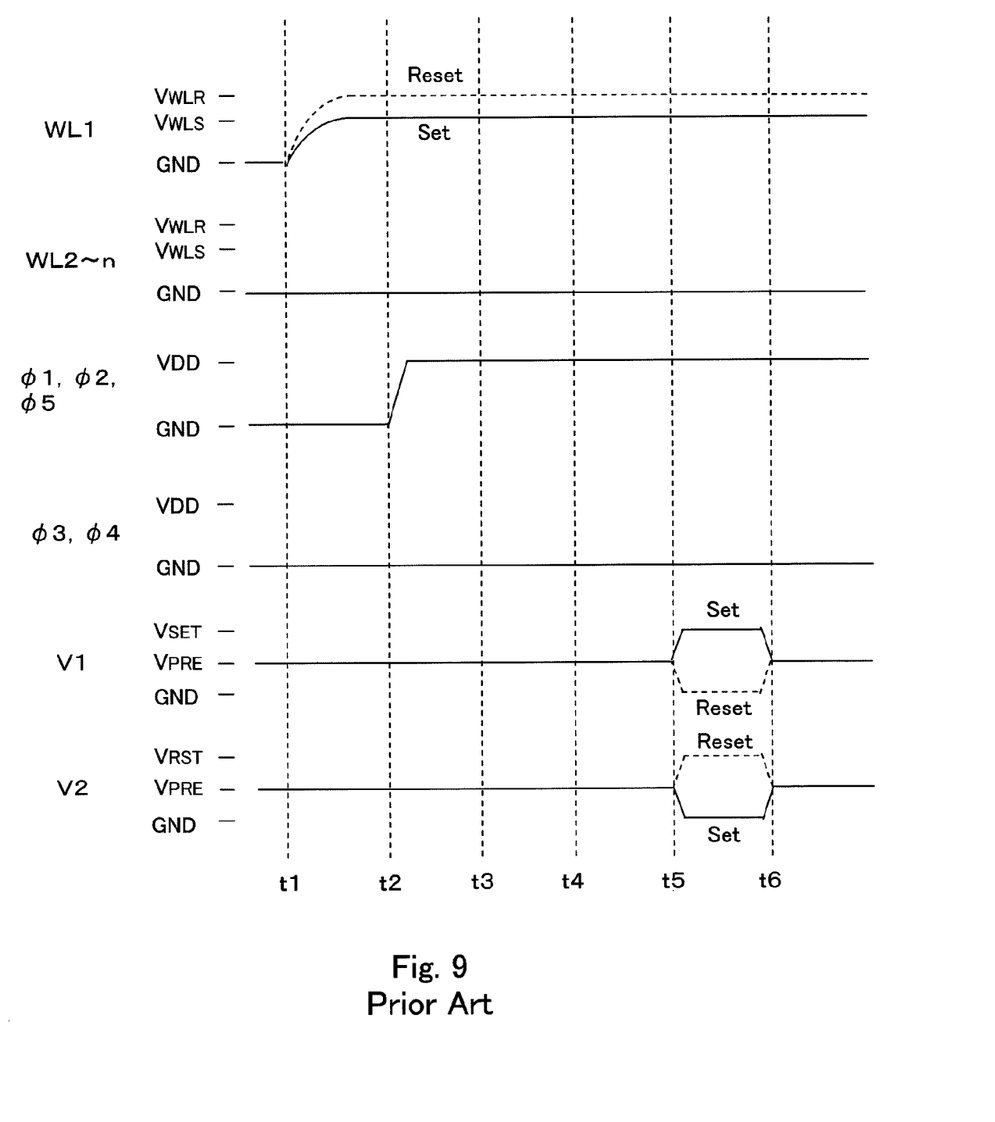
FIG. 9 is a chart showing the timing at which a conventional semiconductor memory device is written.

FIG. 9 shows the timing at which the variable resistive element R11 in FIG. 8 is written. Hereinafter the operation for lowering the resistance of the variable resistive element is At time t1, the voltage applied to the word line WL1 is raised to a voltage $V_{WLS}$ (typically 4 V) at the time of setting and to a voltage $V_{WLR}$ (typically 6 V) at the time of resetting, and after that, at time t2, φ1, φ2 and φ5 are raised, and the initialization operation is carried out. That is to say, the voltage of the power supply line V1 is applied to the selected bit line BL1 and the voltage of the power supply line V2 is applied to the common line CML via the transistors in the writing voltage applying circuit 801, and furthermore, the same voltage as for the common line CML is applied to the unselected bit lines BL2 and so on via the transistors in the initialization circuit 802, so that the voltage of the unselected bit lines is initialized. At this time, the voltage of the power supply lines V1 and V2 is the same initialization voltage $V_{PRE}$ (typically 1.5 V), and as a result, the common line CML and all of the bit lines BL1, BL2 and so on are pre-charged to the same voltage $V_{PRE}$.

After that, at time t5 to t6, a writing voltage pulse is applied to the power supply lines V1 and V2. That is to say, at the time of setting, the voltage in the power supply line V1 is converted to a voltage $V_{SET}$ (typically 3V) and the voltage in the power supply line V2 is converted to GND, so that a current flows from the selected bit line BL1 to the common line CML via R11 and Q11. Meanwhile, at the time of resetting, the voltage in the power supply line V1 is converted to GND and the voltage of the power supply line V2 is converted to a voltage $V_{RST}$ (typically 3 V), so that a current flows from the common line CML to the selected bit line BL1 via Q11 and R11.

Although in the array structure shown in FIG. 8, the leak current and the roundabout current can be prevented from flowing through unselected memory cells, a voltage is applied to adjacent unselected memory cells when writing is repeated in the selected memory cell, and thus, a so-called writing disturbance, where information in adjacent memory cells is written, cannot be prevented. Writing disturbances can be divided into three categories in accordance with its cause. In the following, the three types of writing disturbances are described in reference with FIG. 8, which shows the array structure, and FIG. 9, which is a timing chart for the writing.

First, the first type of writing disturbance is "selected bit line disturbance", which is caused in unselected variable resistive elements R12 to R1$n$ which are connected to the selected bit line BL1 when the writing voltage pulse is applied to the power supply line V1 at time t5, so that the voltage in the selected bit line BL1 changes. For example, in the unselected variable resistive element R12, there is a parasitic capacitance C, although small, in the connection point node #A between the variable resistive element R12 and the cell transistor Q12. Since the transistor Q12 connected to the unselected word line WL2 is turned off, the node #A is connected only to the selected bit line BL1 via the variable resistive element R12. Accordingly, when the voltage of the selected bit line BL1 fluctuates, this fluctuation is conveyed to the node #A with a delay of time constant RC (typically 10 ns), which is determined by the resistance value R of the variable resistive element R12 (typically 1 MΩ when the RRAM is in a high resistance state) and the parasitic capacitance C at the node #A (typically 10 fF). Therefore, there is a difference in potential which corresponds to the delay in the voltage fluctuation between the two ends of the variable resistive element R12.

Next, the second type of writing disturbance is "unselected bit line disturbance", which is caused in variable resistive elements R22 to R2n and so on connected to the unselected bit lines BL2 and so on. This is because φ5 remains high when the writing voltage pulse is applied to the power supply line V2 at time t5, so that the voltage in the common line CML changes, and therefore, the voltage in the unselected bit lines BL2 and so on changes to the same voltage as in the common line CML. In the variable resistive element R22, there is a parasitic capacitance C, although small, at the connection point node #B between the variable resistive element R22 and the transistor Q22. Since the transistor Q22 connected to an unselected word line WL2 is turned off, the node #B is connected only to the unselected bit line BL2 via the variable resistive element R22. Accordingly, when the voltage of the unselected bit line BL2 fluctuates, this fluctuation is conveyed to the node #B with a delay in the time constant RC (typically 10 ns), which is determined by the resistance value R of the variable resistive element R22 (typically 1 MΩ when the RRAM is in a high resistance state) and the parasitic capacitance C at the node B (typically 10 fF). Therefore, there is a difference in potential which corresponds to the delay in the voltage fluctuation between the two ends of the variable resistive element R22.

Figure 10:
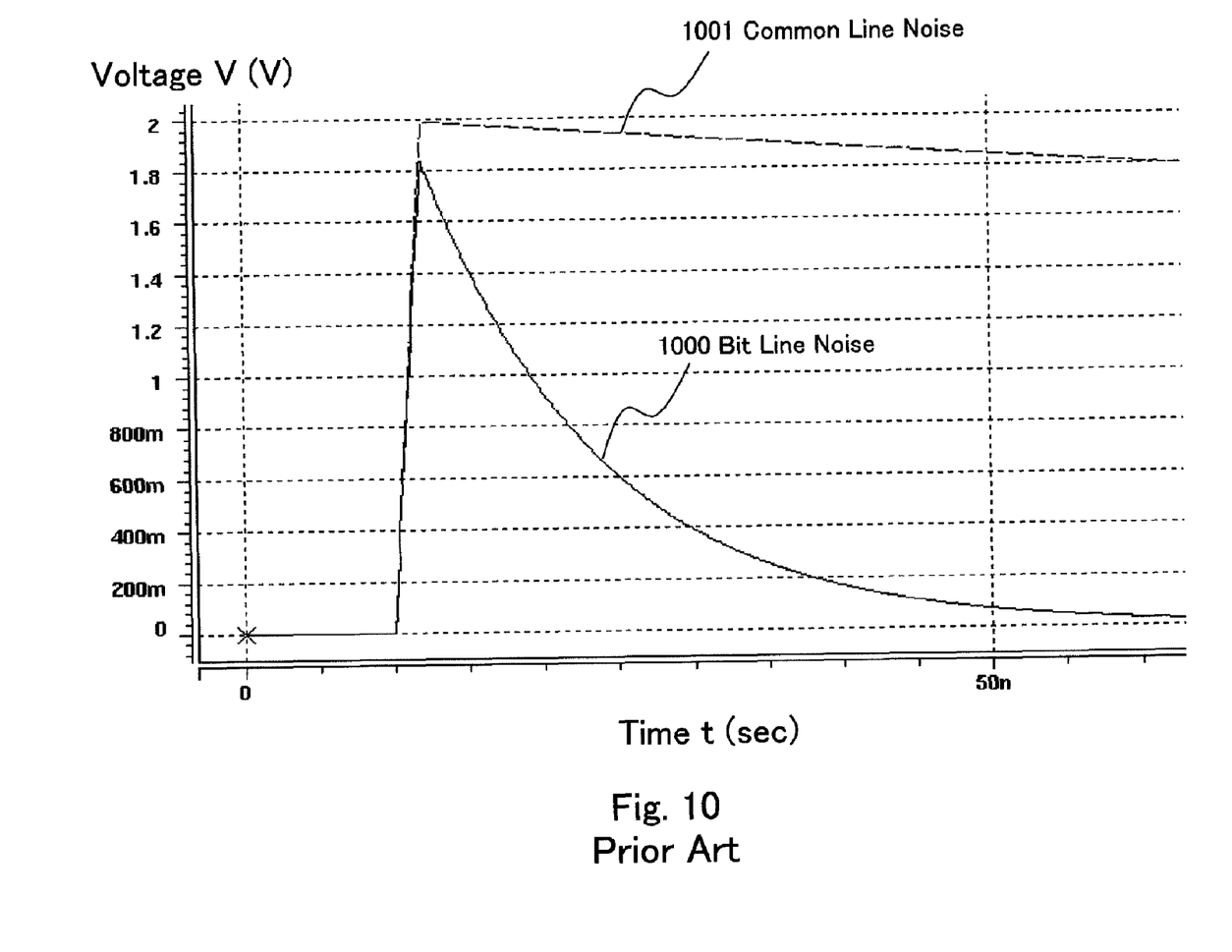
FIG. 10 is a diagram showing an example of a simulation of writing disturbance in a conventional semiconductor memory device.

FIG. 10 shows bit line noise 1000 caused by the selected bit line disturbance or unselected bit line disturbance, which is the absolute value of the voltage fluctuation that is applied across the two ends of the variable resistive element R12 or R22. These are the results of a simulation for a case where a writing voltage pulse of +2V is applied to the selected bit line BL1 or the unselected bit line BL2 for 50 ns with an initialization time of 2 ns, and it is clear from this that a pulse with a peak voltage of 1.8 V having a width of 10 ns at half height is also applied to unselected memory cells. This is sufficiently large disturbance in comparison with the width of the writing pulse applied to selected cells, which is approximately 50 ns.

In order to prevent "unselected bit line disturbance", which is the second type of writing disturbance, it is desirable to make the voltage fluctuation in non-selected bit lines via the common line as soft as possible. However, the delay in the conveyance of the signal between wires causes a difference in the change in voltage between unselected bit lines BL2 and so on and the common line CML, and as a result, the difference in potential is applied to variable resistive elements R21 and so on aligned in the row direction along the selected word line WL1. This is because the cell transistors Q21 and so on connected to the selected word line WL1 are turned on in these variable resistive elements. For example, the voltage fluctuation in the unselected bit line BL2 via the common line is conveyed to the node #0 with a delay of time constant RC (typically 1 µs), which is determined by the resistance value R in the variable resistive element R21 (typically 1 MΩ when the RRAM is in a high resistance state) and the parasitic capacitance C between wires (typically 1 pF). As a result, a difference in potential that corresponds to the delay in the voltage fluctuation between the unselected bit line BL2 and the common line CML is applied across the two ends of the variable resistive element R21.

This is the third type of writing disturbance, which is hereinafter referred to as "common line disturbance". Common line noise 1001 in FIG. 10 shows the absolute value of the voltage fluctuation that is applied across the two ends of the variable resistive element R21 in the case where the voltage fluctuation of the unselected bit lines is very slow. These are the results of a simulation for a case where a writing voltage pulse of +2 V having an time for initialization of 2 ns is applied to the common line for 50 ns, where the writing voltage ends up being applied to unselected memory cells for a long period of time. As is clear from the above, "the common line disturbance" and "the unselected bit line disturbance" are related in that when one is suppressed the other grows, and therefore, it is very difficult to provide a design that is appropriate to suppress both.

As a measure for suppressing the above describe disturbances, Japanese Unexamined Patent Publication 2004-185755 discloses a method according to which the transistors of individual memory cells are connected to bit lines and the variable resistive elements of individual memory cells are connected to the common line (source line), so that a writing voltage pulse can be applied from the bit line side. In this method, although the disturbance can be suppressed in the case where a writing voltage pulse is applied from the bit line side, the disturbance cannot be suppressed in the case where a writing voltage pulse is applied from the common line side. Particularly in the case where variable resistive elements having bipolar properties are used for storing information, the setting operation and the resetting operation are carried out by applying a voltage pulse of a different polarity, and therefore, it becomes necessary to apply a writing voltage pulse from the common line side, and in this case, the writing disturbance cannot be suppressed completely.

In order to completely suppress the disturbances, two cell transistors for selecting a memory cell are provided and connected to the two ends of the variable resistive element in the memory cell, as shown in FIG. 4 in Japanese Unexamined Patent Publication 2004-185755. However, three elements are required per cell, and the area for the cell array becomes large.

Incidentally, semiconductor memory devices using variable resistive elements for storing information are expected to be used as nonvolatile memories for storing digital camera images and nonvolatile memories for cellular phones and other electronics. When used as a nonvolatile memory for a digital camera, however, it is necessary to keep the chip area small in order to lower the cost per bit. Furthermore, even a one-pixel error lowers the quality of the image stored in the nonvolatile memory, and therefore, the reliability of the data must be kept high when stored. Moreover, the reliability of the data must be kept high when stored for a long period of time. In addition, when used as a nonvolatile memory in other electronics, for example in a cellular phone, a communication protocol is recorded together with image data, and therefore, the data has to be highly reliable.

That is to say, although it is desired for the above-described semiconductor memory device to be put into practice as a nonvolatile memory which is highly reliable when written, the writing disturbance cannot be suppressed without increasing the cell array area as long as the memory cell array has a conventional structure, and thus, a highly reliable nonvolatile memory cannot be implemented while preventing the cell array area from being large.

SUMMARY OF THE INVENTION

An object of the present invention is to provide a highly reliable semiconductor memory device where writing disturbances can be suppressed in a 1T1R type memory cell array where each cell has one memory element and one cell transistor, without increasing the number of elements per cell.

The first characteristic of the semiconductor memory device according to the present invention is that it has a memory cell array formed of a number of memory cells aligned in a matrix shape in the row and column directions, each memory cell comprising a memory element and a cell transistor, wherein the memory element has two input/output terminals so that information is stored using a difference in the electrical properties between the two terminals and the stored information is written by applying a writing voltage across the two terminals, the cell transistor has two input/output terminals and one control terminal, and a first end of the input/output terminal of the memory element and a first end of the input/output terminal of the cell transistor are connected; word lines extending in the row direction for connecting control terminals of the cell transistors in the memory cells aligned in the same rows to each other; first bit lines extending in the column direction for connecting second ends of the input/output terminals of the cell transistors in the memory cells aligned in the same columns to each other, the second ends being not connected to the memory elements; second bit lines extending in the row or column direction for connecting second ends of the input/output terminals of the memory elements in the memory cells to each other, the second ends being not connected to the cell transistors; a word line voltage applying circuit for applying a voltage to a word line connected to the memory cell selected to be written; a first voltage applying circuit for applying the writing voltage to the first bit line connected to the selected memory cell; and a second voltage applying circuit for applying a pre-charge voltage to both the first bit line and the second bit line connected to the selected memory cell before the application of the writing voltage.

Furthermore, the second characteristic of the semiconductor memory device according to the present invention is that, in addition to the above-described first characteristic, the second bit lines extend in the column direction.

In accordance with the semiconductor memory device having the above-described first or second characteristic, at the time of the writing operation for the selected memory cell, a voltage pulse for writing is applied by the first voltage applying circuit through the first bit line to which the cell transistor in the memory cell is connected, and at this time, a certain pre-charge voltage is applied to the second bit line connected to the memory element of the selected memory cell, and therefore, writing disturbances can be suppressed within unselected memory cells along the second bit line.

Furthermore, the first bit lines to which a writing voltage is applied are perpendicular to the word lines, and therefore, writing disturbances coming from the selected word line can be suppressed within unselected memory cells.

In addition, the third characteristic of the semiconductor memory device according to the present invention is that in addition to either the above-described first or second characteristic, in the memory cell array, two adjacent rows of memory cells share one second bit line in the case where the second bit lines extend in the row direction, and two adjacent columns of memory cells share one second bit line in the case where the second bit lines extend in the column direction.

In accordance with the semiconductor memory device having the above-described third characteristic, adjacent columns of memory cells or adjacent rows of memory cells share a second bit line, and therefore, the cell array area can be reduced and the semiconductor memory device can be fabricated at low cost.

In addition, the fourth characteristic of the semiconductor memory device according to the present invention is that in addition to any of the above-described first to third characteristics, the second voltage applying circuit has a pre-charge power supply line to which the pre-charge voltage is applied, and the pre-charge power supply line is directly connected to each of the second bit lines and connected to each of the first bit lines via a first transistor.

In accordance with the semiconductor memory device having the above-described fourth characteristic, the second bit lines are directly connected to the pre-charge power supply line so that a constant pre-charge voltage is applied to the second bit lines, and thus, writing disturbances can be suppressed. In addition, transistors for connecting the first bit lines to the pre-charge power supply line are provided so that the first bit lines have the same voltage as the second bit lines only during the pre-charging period, and thus, disturbances can be prevented from being caused in the unselected memory cells via the unselected second bit lines or the selected word line.

In addition, the fifth characteristic of the semiconductor memory device according to the present invention is that, in addition to any of the above-described first to fourth characteristics, the first voltage applying circuit has a writing power supply line to which the writing voltage is applied, and the writing power supply line is connected to each of the first bit lines via a second transistor.

In accordance with the semiconductor memory device having the above-described fifth characteristic, a voltage pulse for writing is applied through the first bit line to which the cell transistor of the memory cell is connected, and therefore, writing disturbances can be suppressed within the unselected memory cells along the second bit line.

In addition, the sixth characteristic of the semiconductor memory device according to the present invention is that, in addition to any of the above-described first to fourth characteristics, the first voltage applying circuit has a first writing power supply line and a second writing power supply line to which the writing voltages different from the pre-charge voltage are applied, respectively.

In addition, the seventh characteristic of the semiconductor memory device according to the present invention is that, in addition to the above-described sixth characteristic, the first writing power supply line is connected to each of the first bit lines via a third transistor, and the second writing power supply line is connected to each of the first bit lines via a fourth transistor.

In accordance with the semiconductor memory device having either the above-described sixth or seventh characteristic, a writing voltage from the first writing power supply line or a writing voltage from the second writing power supply line can be selected so as to be applied to the first bit lines so that the voltage applied to the first bit lines can be switched using the third and fourth transistors, and therefore, one of the two different writing voltages can be applied to a number of memory cells selected by the same word line at the same time, and thus, a writing operation can be carried out in accordance with the storage state of the memory cell.

In addition, the eighth characteristic of the semiconductor memory device according to the present invention is that, in addition to either the above-described sixth or seventh characteristic, the pre-charge voltage is a voltage between one of the writing voltages applied to the first writing power supply line and the other one of the writing voltages applied to the second writing power supply line.

In accordance with the semiconductor memory device having the above-described eighth characteristic, the polarity of the writing voltage applied to a first bit line using the pre-charge voltage as a reference voltage can be switched between the case where the writing voltage is supplied through the first writing power supply line and the case where the writing voltage is supplied through the second writing power supply line, and thus, the polarity of the writing voltage pulse applied to the variable resistive element in the selected memory cell can be switched between the case where the writing voltage is supplied through the first writing power supply line and the case where the writing voltage is supplied through the second writing power supply line.

In addition, the ninth characteristic of the semiconductor memory device according to the present invention is that, in addition to any of the above-described first to eighth characteristics, the memory elements are variable resistive elements of which the resistance state represented by the resistance properties between the two input/output terminals of the memory cells transitions through the application of the writing voltage.

Concerning the memory elements used in the semiconductor memory device having any of the above-described first to eighth characteristics of the present invention, the invention can be applied to memory elements for storing information using a difference in the electrical properties and for writing stored information through the application of a voltage, such as magnetic tunnel junction elements used in MRAM's, and variable resistive elements used in phase change memories (PCRAM's), OUM's (ovonic unified memories) and RRAM's. Preferably, the invention is especially useful for the variable resistive element used in RRAM's. These variable resistive elements are different from other memory elements where information is written using a magnetic field or joule heat generated through the application of a voltage, and writing is carried out by directly changing the electrical resistance through the application of a writing voltage, and therefore, it is necessary to suppress writing disturbances without fail. The structure of the semiconductor memory device according to the present invention can allow the implementation of a highly reliable semiconductor memory device where writing disturbances can be suppressed.

As a result, the semiconductor memory device having any of the above-described first to ninth characteristics can be adopted in a non-volatile memory incorporated in an electronic apparatus, for example, a cellular phone, a digital camera, a digital voice recorder, a DVD apparatus, a color tone adjusting circuit for liquid crystal display devices, a music recording and reproducing apparatus, a video apparatus, an audio device or a copier, so that a highly reliable electronic apparatus that makes the miniaturization of a chip possible can be provided.

Therefore, when the configuration according to the present invention is provided in a semiconductor memory device where memory elements having only two terminals across which a voltage can be applied can be used in the memory cells, and as a result, a writing disturbance is easily caused in the unselected memory cells, the disturbance can be suppressed in order to hold data with a high level of reliability, and in addition, unit memory cells can be formed of one memory cell and one cell transistor, and thus, a highly reliable semiconductor memory device can be provided at low cost.

DETAILED DESCRIPTION OF THE INVENTION

First Embodiment

Figure 1:
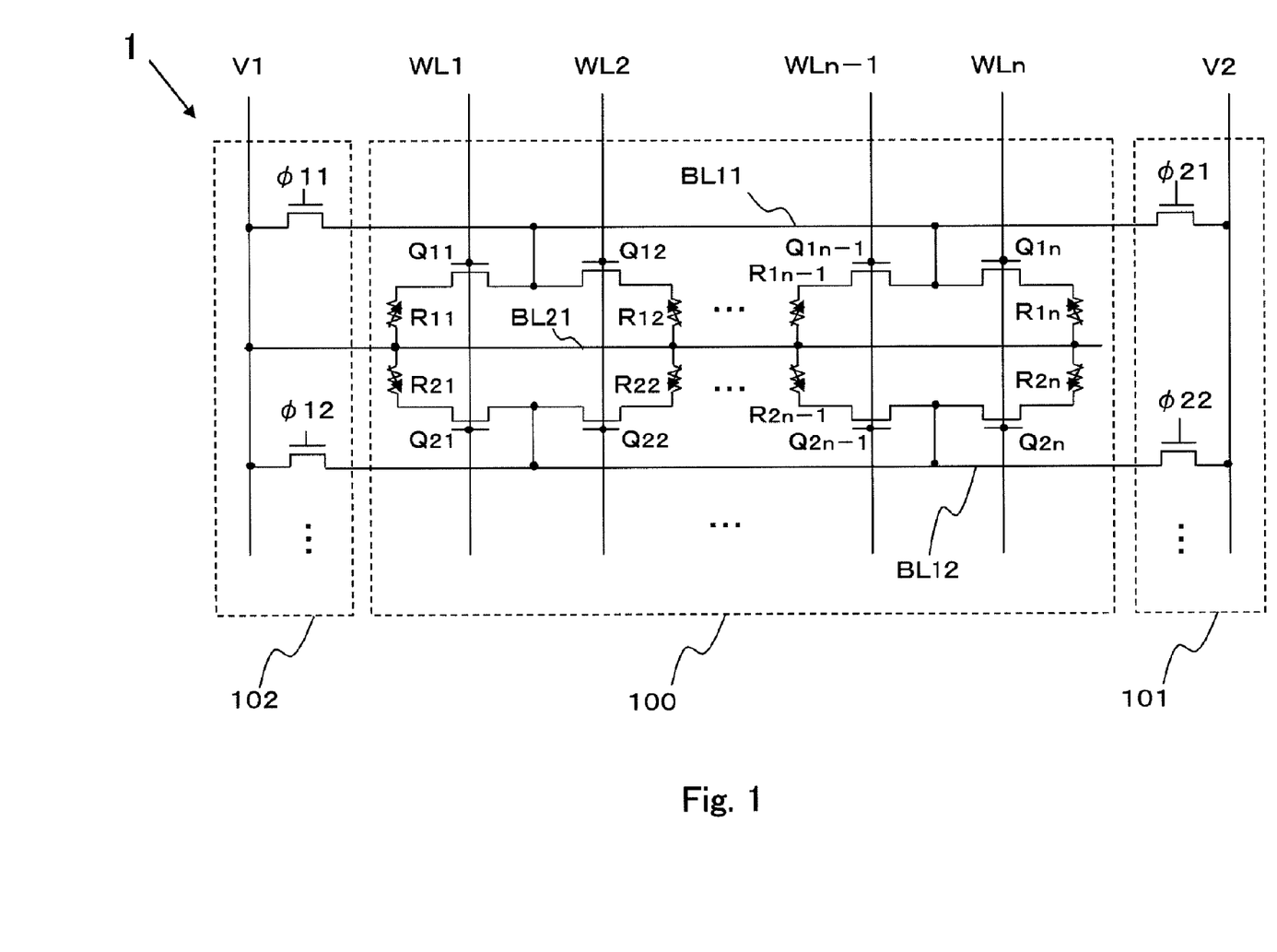
FIG. 1 is a diagram showing the circuit structure of the semiconductor memory device according to the first embodiment of the present invention.

FIG. 1 is a diagram showing the circuit structure of the semiconductor memory device according to one embodiment of the present invention (hereinafter referred to as device of present invention 1). The device 1 of the present invention has a memory cell array 100, a first voltage applying circuit 101 and a second voltage applying circuit 102, and the memory cell array 100 is formed of variable resistive elements R11 to R1n, R21 to R2n and so on, and transistors for selecting a memory cell Q11 to Q1n, Q21 to Q2n and so on, which are aligned in a matrix shape in the row direction (longitudinal direction in the figure) and the column direction (lateral direction in the figure). In each memory cell, a first end of the variable resistive element and a first end of the input/output terminals of the transistor are connected. Second ends of the input/output terminals of the transistors, which are not connected to the variable resistive elements, in the memory cells aligned in the same column are connected to the first bit lines BL11, BL12 and so on, respectively, while second ends of the variable resistive elements, which are not connected to the transistors, in the memory cells aligned in the same column are connected to the second bit lines BL21 and so on, respectively. The control terminals of the transistors in the memory cells aligned in the same row are connected to respective word lines WL1 to WLn. During the writing/reading out operation for a memory cell within the memory cell array 100, the memory cell on which the operation is to be carried out is selected, and a selected word line voltage and a selected first bit line voltage are applied to the word line and first bit line connected to the selected memory cell, respectively, while an unselected first bit line voltage is applied to each first bit line connected to the unselected memory cells, and a pre-charge voltage is applied to the second bit lines, so that the information stored in the variable resistive element in the selected memory cell can be written and read out.

The first voltage applying circuit 101 supplies the writing voltage for writing information stored in the variable resistive element in the selected memory cell to the first bit line connected to each of the selected memory cells via the writing power supply line V2. A writing power supply voltage V2 and the respective first bit lines are connected via transistors for switching, so that it is possible to select a first bit line to which the writing voltage is to be applied using a switching signal φ21, φ22 and so on.

The second voltage applying circuit 102 supplies the pre-charge voltage to the first bit line and the second bit line connected to the selected memory cell via the pre-charge power supply line V1. The pre-charge power supply line V1 and the respective first bit lines are connected via transistors for switching, so that it is possible to select a first bit line to which the pre-charge voltage is to be applied using a switching signal φ11, φ12 and so on. Meanwhile, the pre-charge power supply line V1 is connected directly to the respective second bit lines, so that the pre-charge voltage is applied to all of the second bit lines. The pre-charge voltage is applied to the first bit lines, which are connected to the selected and unselected memory cells, before the writing voltage is applied via the writing power supply line V2 in the first voltage applying circuit 101 and the first bit lines, via the pre-charge power supply line V1 and the transistors for switching. As a result, in all of the unselected memory cells connected to the second bit line to which the selected memory cell is connected, the two ends of the memory cell made of a variable resistive element and a transistor can be made of the potential in advance, irrespectively of whether the memory cell is connected to the selected word line or to an unselected word line.

In addition, a word line voltage applying circuit, not shown, respectively supplies a selected word line voltage to the selected word lines WL1, WL2 and so on up to WLn connected to the selected memory cell. The word line voltage applying circuit and the respective word lines are connected via the respective transistors for switching (not shown), so that it is possible to select a word line to which the selected word line voltage is to be applied using a switching signal.

Figure 2:
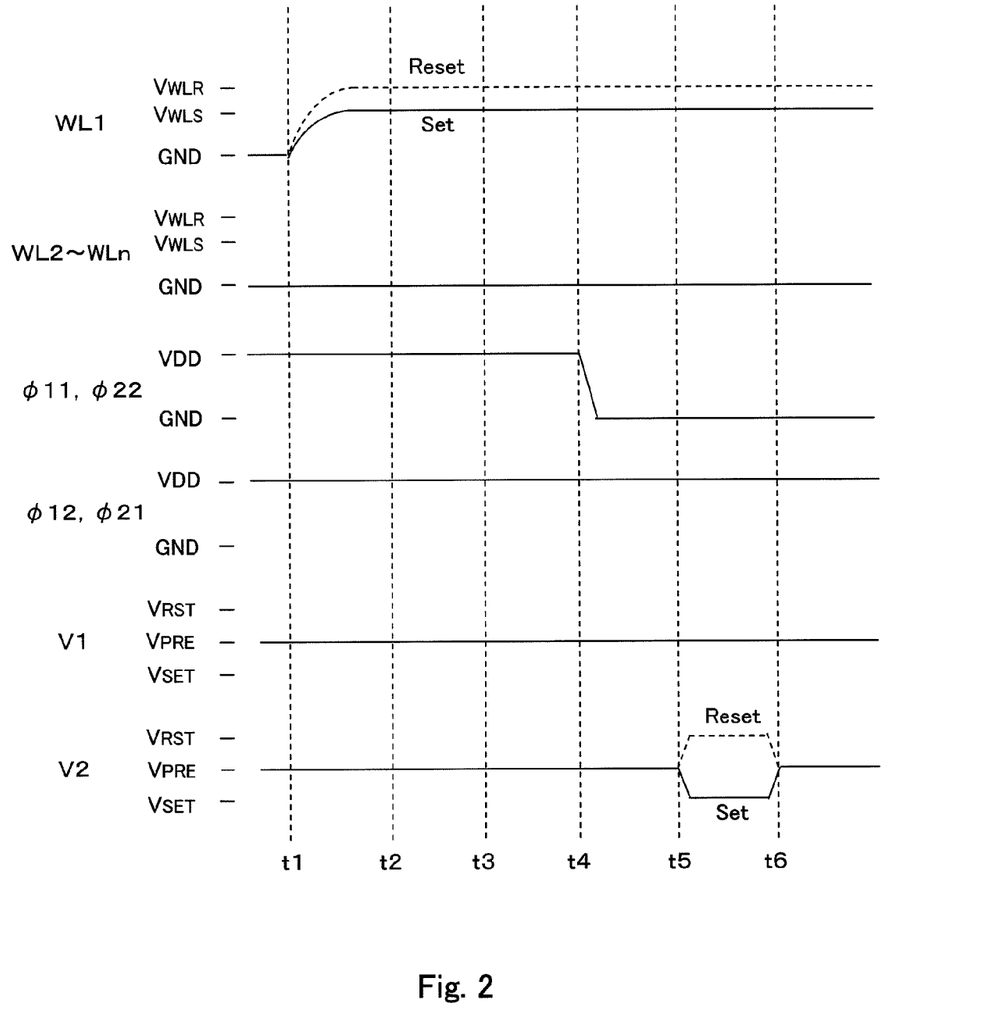
FIG. 2 is a timing chart showing the timing at which the semiconductor memory device according to the first embodiment is written.

FIG. 2 is a timing chart showing voltage signals in the word lines WL1 to WLn, switching signals φ11, φ12, φ21 and φ22, the pre-charge power supply line V1 and the writing power supply line V2 during writing in the device 1 of the present invention. Here, FIG. 2 shows an example of a timing chart in the case where the variable resistive element R11 in FIG. 1 is concretely written.

First, φ11, φ12 and so on up to φ21 and φ22 are raised, and a pre-charge voltage $V_{PRE}$ (typically 3 V) is applied to the first and second bit lines from the pre-charge power supply line V1 and the writing power supply line V2 via the switching transistors in the first voltage applying circuit 101 and the second voltage applying circuit 102, so that all of the memory cells are pre-charged to $V_{PRE}$ in advance.

The word line WL1 is charged to a voltage $V_{WLS}$ (typically 4V) in the case of setting, and to a voltage $V_{WLR}$ (typically 9 V) in the case of resetting at time t1, and after that, φ11 and φ21 are lowered at time t4, so that the pre-charging operation is completed. Next, a writing voltage pulse is applied to the writing power supply voltage V2 at time t5 to t6. That is to say, at the time of setting, the writing power supply line V2 is converted to a voltage $V_{SET}$ (typically 0 V) so that a current flows from the selected second bit line BL21 to the selected first bit line BL11 via R11 and Q11. Meanwhile, at the time of resetting, the writing power supply line V2 is converted to a voltage $V_{RST}$ (typically 6 V), so that a current flows from the selected first bit line BL11 to the selected second bit line BL21 via Q11 and R11.

In the writing method for the device 1 of the present invention shown in FIG. 2, three types of writing disturbances which are difficult to suppress in the prior art can all be suppressed, as described below.

First, the second bit lines BL21 and so on in the device 1 of the present invention correspond to conventional bit lines, and "selected bit line disturbance", which is the first type of writing disturbance, is caused in the memory cells R12 to R1n and R21 to R2n aligned in the column direction in the case where the voltage of the second bit line BL21 fluctuates in the structure of the present invention. However, the second bit line BL21 is connected directly to the pre-charge power supply line V1 in the second voltage applying circuit 102, and as is clear from the writing timing in FIG. 2, a constant voltage $V_{PRE}$ is continuously supplied to the pre-charge power supply line V1 during the writing operation, and therefore, the voltage in the second bit line B21 does not fluctuate. Accordingly, no "selected bit line disturbance" is caused.

Next, concerning "unselected bit line disturbance", which is the second type of writing disturbance, the second bit lines are connected to the pre-charge power supply line V1, irrespectively of whether they are selected or not, in the device 1 of the present invention, so that a constant voltage $V_{PRE}$ is applied during the writing operation, and thus, the voltage of the second bit lines does not fluctuate. Accordingly, "unselected bit line disturbance" is also not caused as well as the "selected bit line disturbance".

Furthermore, concerning "common line disturbance", which is the third type of writing disturbance, the first bit lines BL11, BL12 and so on in the device 1 of the present invention correspond to conventional common lines, and these are not wires shared by all of the memory cells, unlike the common lines in conventional circuits, but respectively connected to the writing power supply line V2 via the transistors in the first voltage applying circuit 101. In addition, as is clear from the writing timing in FIG. 2, φ22 is lowered before the writing voltage pulse is applied, and therefore, the voltage pulse in the writing power supply line V2 is not applied to the unselected first bit lines BL12 and so on, and a constant pre-charge voltage $V_{PRE}$ is applied via the transistors in the second voltage applying circuit 102, and therefore, the voltage does not fluctuate. Accordingly, no disturbance corresponding to "common line disturbance" is caused in the unselected memory cells R21 and so on aligned in the row direction along the selected word line WL1.

Accordingly, the device 1 of the present invention can carry out a writing operation while suppressing the above-described writing disturbance in the conventional 1T1R type memory cell array, where each cell has one variable resistive element and one transistor.

Although a writing operation in the case where one memory cell in the device 1 of the present invention is selected and the variable resistive element is written is described in the above, it is clear that a number of memory cells connected to the same word line can be selected so that a setting or resetting operation can be collectively and simultaneously carried out on the variable resistive elements, and in this case also, the writing disturbance is not caused.

Figure 3:
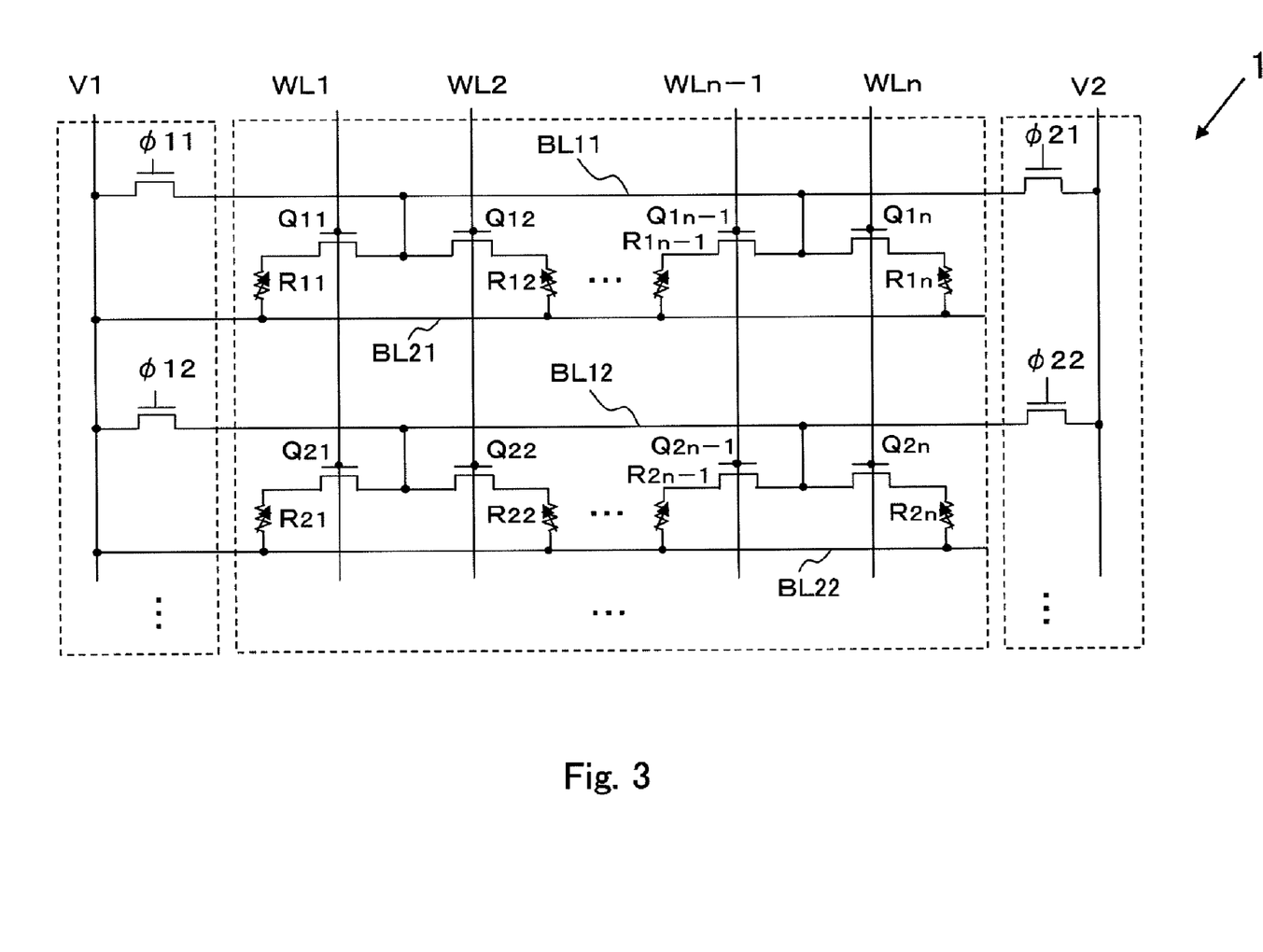
FIG. 3 is a diagram showing the circuit structure of the semiconductor memory device according to the first embodiment of the present invention.

In addition, although variable resistive elements R11 to R1n and R21 to R2n aligned in the column direction are all connected to the second bit line BL21 in the structure of the memory cell array of the device 1 of the present invention, two second bit lines BL21 and BL22 may be provided in the structure instead of one bit line, as shown in FIG. 3. The timing and operation for writing, as well as the effects against writing disturbance, are the same as in FIGS. 1 and 2. However, the structure in FIG. 1 generally allows the area for the layout to be smaller, although it depends on the layout.

Second Embodiment

Figure 4:
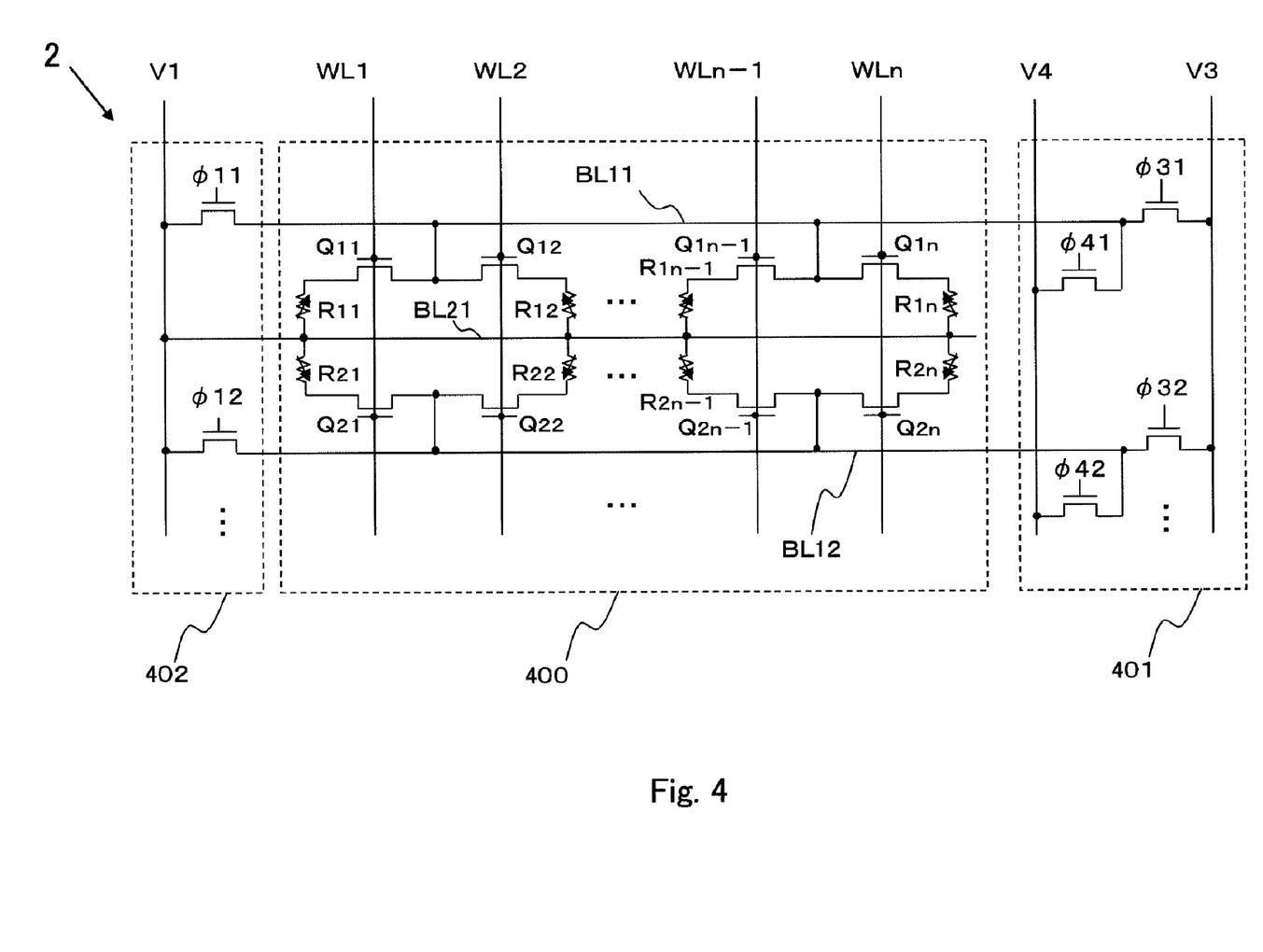
FIG. 4 is a diagram showing the circuit structure of the semiconductor memory device according to the second embodiment of the present invention.

FIG. 4 is a diagram showing the circuit structure of the semiconductor memory device according to one embodiment of the present invention (hereinafter referred to as device 2 of the present invention). The device 2 of the present invention has a memory cell array 400, a first voltage applying circuit 401 and a second voltage applying circuit 402. The structure of the memory cell array 400 and the second voltage applying circuit 402 is the same as that of the memory cell array 100 and the second voltage applying circuit 102 in the device 1 of the present invention according to the first embodiment shown in FIG. 1, respectively, and therefore, the description thereof is not repeated. The structure of the word line applying circuit (not shown) is the same as that of the device 1 of the present invention, and the description thereof is not repeated.

The first voltage applying circuit 401 supplies a writing voltage for writing information stored in the variable resistive element in the selected memory cell to the first bit line connected to each of the selected memory cells via the first writing power supply line V3 or the second writing power supply line V4. The first writing power supply line V3 and the first bit lines are connected via the respective transistors for switching, so that the first bit line for applying a writing voltage can be selected using a switching signal φ31, φ32 and so on. In addition, the second writing power supply line V4 and the first bit lines are connected via the respective transistors for switching, so that the first bit line for applying a writing voltage can be selected using a switching signal φ41, φ42 and so on. The voltage applied to the first writing power supply line V3 and the voltage applied to the second writing power supply line V4 are different, and as a result, either the voltage applied to the first writing power supply line V3 or the voltage applied to the second writing power supply line V4 can be selected based on the switching signals φ31, φ32 and so on, as well as φ41, φ42 and so on, so as to be applied to a number of variable resistive elements connected to different first bit lines at the same.

Figure 5:
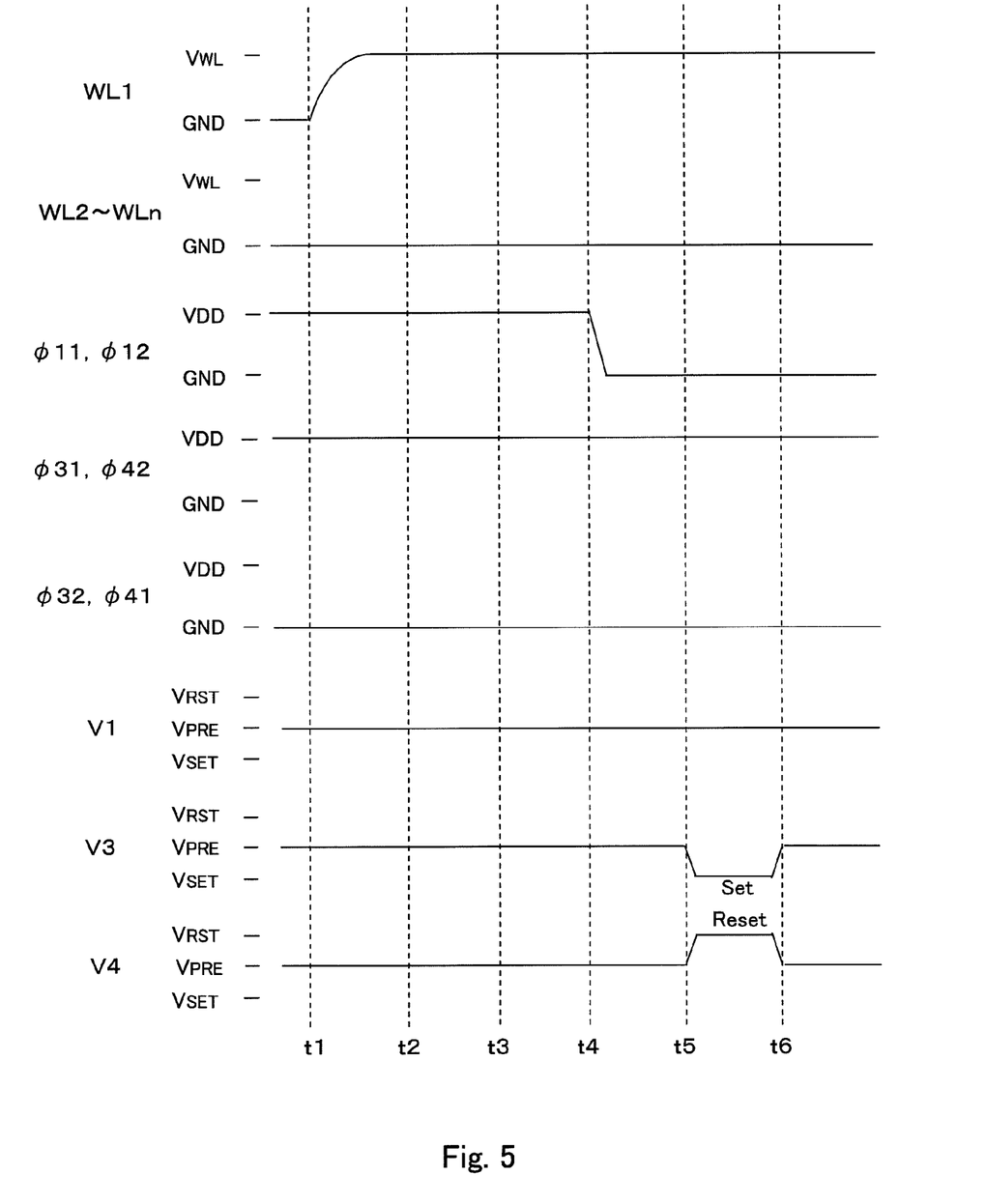
FIG. 5 is a timing chart showing the timing at which the semiconductor memory device according to the second embodiment is written.

FIG. 5 is a timing chart showing voltage signals in the word lines WL1 to WLn, switching signals φ11, φ12 and so on, φ31, φ32 and so on, and φ41, φ42 and so on, the pre-charging power supply line V1, the first writing power supply line V3 and the second writing power supply line V4 at the time of writing of the device 2 of the present invention. Unlike in the first embodiment, where the voltage of the selected word line is different between at the time of the setting and at the time of the resetting operation, the same word line voltage $V_{WL}$ can be used at the time of the setting operation and at the time of the resetting operation. Accordingly, the setting operation and the resetting operation can be carried out at the same time on each of the number of variable resistive elements connected to the same word line and different first bit lines. Here, an example of a case where R11 is set and R21 is reset is described.

Initially, φ11, φ12 and so on are raised, and the voltage $V_{PRE}$ (typically 3 V) of the pre-charging power supply line V1 is applied directly to the second bit lines so as to be applied to the first bit lines via the switching transistors in the second voltage applying circuit 402. In addition, φ31 and φ42 are raised and φ32 and φ41 are lowered, so that the voltage $V_{PRE}$ from the first writing power supply line V3 is applied to the first bit line BL11 via the transistor in the first voltage applying circuit 401, and the voltage $V_{PRE}$ from the second writing power supply line V4 is applied to the first bit line B12, so that all of the memory cells are pre-charged to $V_{PRE}$ in advance.

The word line WL1 is raised to a voltage $V_{WL}$ (typically 6 V) at time t1, and after that φ11 and φ12 are lowered at time t4, so that the pre-charging operation is completed. In addition, the transistor for switching connected to the first bit lines connected to memory cells that are not to be written are turned off, in order to prevent the writing voltage pulse from being applied from the first voltage applying circuit 401 to the first bit lines.

Next, a pulse voltage is applied to the first writing power supply line V3 and the second writing power supply line V4 at time t5 to t6. That is to say, the first writing power supply line V3 for the setting operation is changed to the voltage $V_{SET}$ (typically 0 V), so that a current flows from the selected second bit line BL21 to the selected first bit line BL11 via R11 and Q11, and thus, a setting operation is carried out on the variable resistive element R11. Meanwhile, the second writing power supply line V4 for the resetting operation is changed to the voltage $V_{RST}$ (typically 6 V), so that a current flows from the selected first bit line BL12 to the selected second bit line BL21 via Q21 and R21, and thus a resetting operation is carried out on the variable resistive element R21.

As described above, in accordance with the method for writing the device 2 of the present invention shown in FIG. 5, three types of writing disturbances which were difficult to avoid according to the prior art can all be prevented, for the same reasons as in the first embodiment, and in addition, the setting operation and the resetting operation can be carried out at the same time on each of the number of variable resistive elements connected to the same word line and different first bit lines.

Third Embodiment

Figure 6:
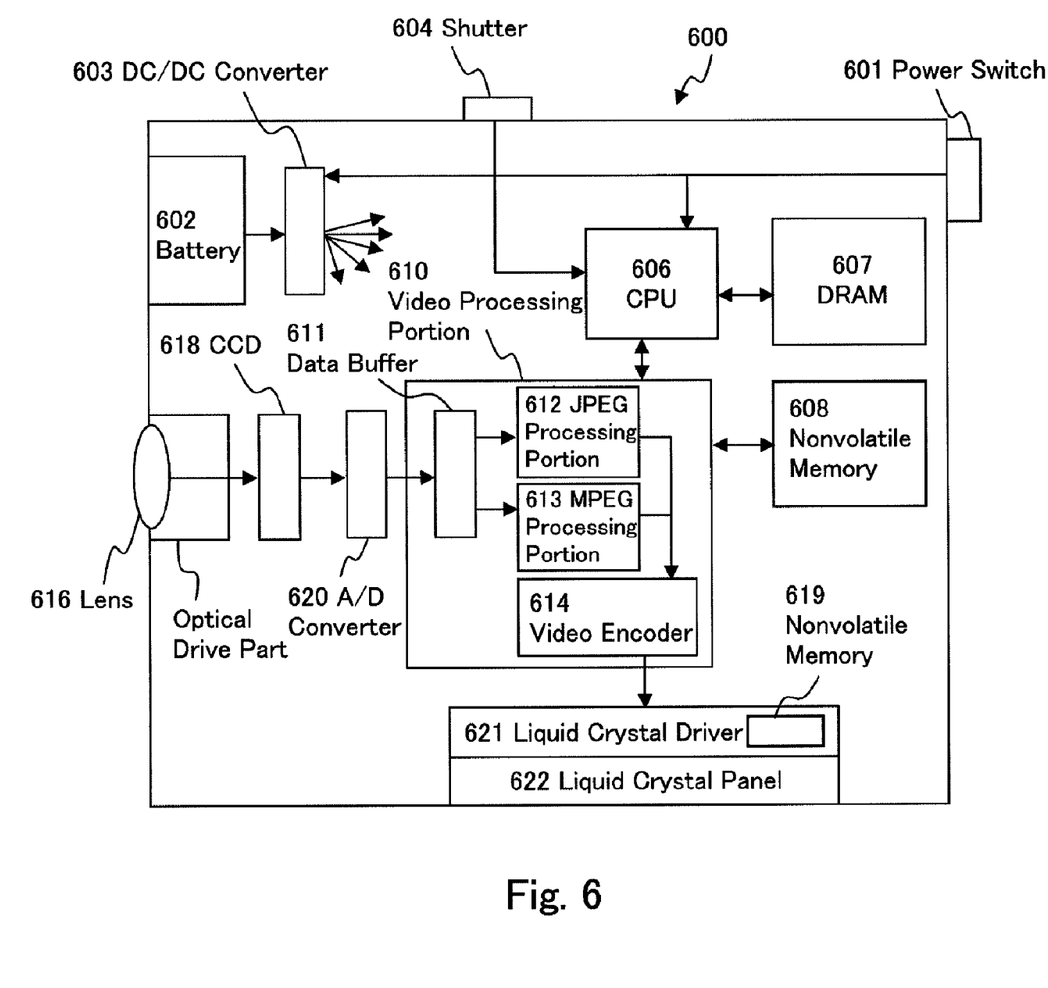
FIG. 6 is a diagram showing the circuit blocks of the electronic apparatus (digital camera) according to the third embodiment of the present invention.

FIG. 6 is a circuit block diagram showing a digital camera having the semiconductor memory device according to the first and second embodiment of the present invention, which is an example of a case where the semiconductor memory device is mounted in an electronic apparatus that is a digital camera in this embodiment. This digital camera 600 has nonvolatile memories 608 and 619 formed of the device 1 of the present invention and the device 2 of the present invention. The nonvolatile memory 608 is used to store images that have been taken, and the nonvolatile memory 619 is used to store values for correcting inconsistency in the liquid crystal panel 622.

When the operator turns on the power switch 601 of the digital camera 600, the power supplied from the battery 602 is transformed to a predetermined voltage in the DC/DC converted 603 and supplied to respective parts. Light that enters through the lens 616 is converted to a current in the CCD 618 and converted to a digital signal in the A/D converter 620 and inputted into the data buffer 611 in the video processing portion 610. Video processing is carried out on the signal inputted into the data buffer 611 in the MPEG processing portion 613, so that the signal passes through the video encoder 614 and is converted to a video signal, which passes through the liquid crystal driver 621 so that an image is displayed on the liquid crystal panel 622. At this time, the liquid crystal driver 621 uses the data in the built-in nonvolatile memory 619 to correct the inconsistency in the liquid crystal panel 622 (for example inconsistency in the coloring, which is different for each liquid crystal panel). When the operator presses down the shutter 604, the information in the data buffer 611 passes through the JPEG processing portion 612 and is processed as a still image and recorded in the nonvolatile memory 608. The nonvolatile memory 608 records system programs and the like, in addition to the information on images that have been taken. The DRAM 607 is used to temporarily store the data generated during various processes in the CPU 606 and the video processing portion 610.

When the semiconductor memory device according to the present invention is adopted for the nonvolatile memories 608 and 619, writing disturbance, which affects the reliability of data storage, can be suppressed, and each cell can be formed of one memory element and one transistor, and therefore, it is possible to miniaturize the chip. Accordingly, electronic apparatuses having the semiconductor memory device according to the present invention are highly reliable and can be made at low cost.

Although the semiconductor memory device according to the present invention is mounted in a digital camera according to the above-described embodiment, it is preferable for the semiconductor memory device according to the present invention to be mounted in a cellular phone. When the semiconductor memory device according to the present invention is mounted in a cellular phone and used as image data, as well as to store a communication protocol, the quality of the cellular phone is significantly higher. Furthermore, the semiconductor memory device according to the present invention can, of course, be mounted in electronic apparatuses other than digital cameras and cellular phones, for example in digital voice recorders, DVD players, color tone adjusting circuits for liquid crystal display devices, music recording and reproducing apparatuses, video apparatuses, audio apparatuses and copiers.

Here, the above-described embodiments are examples of preferred embodiments of the present invention. The embodiments of the present invention are not limited to these, and various modifications are possible within such a scope as not to deviate from the gist of the present invention.

Other Embodiments

Other embodiments are described below.

Figure 7:
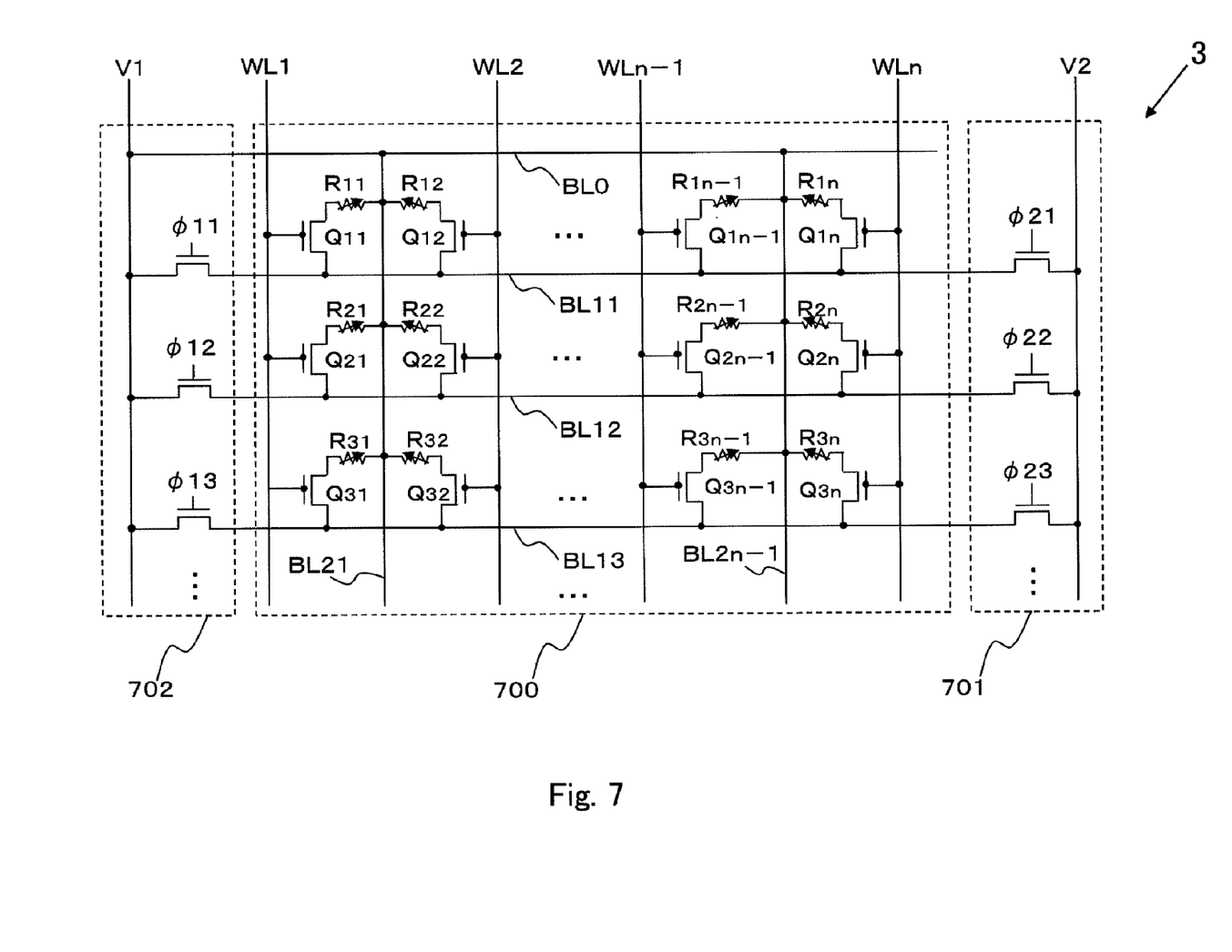
FIG. 7 is a diagram showing the circuit structure of the semiconductor memory device according to another embodiment of the present invention.

(1) Although in the above embodiments, the structure of a memory cell where word lines extend in the row direction and the first bit lines and second bit lines extend in the column direction is illustrated, a structure where the second bit lines extend in the row direction so as to be parallel to the word lines is also possible. FIG. 7 is a diagram showing the circuit structure of the semiconductor memory device according to another embodiment of the present invention (hereinafter referred to as device 3 of the present invention).

The device 3 of the present invention has a memory cell array 700, a first voltage applying circuit 701 and a second voltage applying circuit 702, and in the memory cell array 700, variable resistive elements R11 to R1n, R21 to R2n, R31 to R3n and so on, and transistors for selecting a memory cell Q11 to Q1n, Q21 to Q2n and Q31 to Q3n are aligned in a matrix shape in the row direction (longitudinal direction in the figure) and the column direction (lateral direction in the figure), respectively. In each memory cell, a first end of the variable resistive element and a first end of the input/output terminal of the transistor are connected, and second ends of the input/output terminals of the transistors in the memory cells aligned in the same column are respectively connected to the first bit lines BL11, BL12, BL13 and so on, the second ends being not connected to the variable resistive elements, and the second ends, which are not connected to the transistors of the variable resistive elements in the memory cells aligned in the same row, are respectively connected to the second bit lines BL21 and so on. The control terminals of the transistors in the memory cells aligned in the same row are respectively connected to the word lines WL1, WL2 and so on up to WLn. The second bit lines extend in the row direction, the variable resistive elements R11, R21, R31 and so on, as well as R12, R22, R32 and so on, aligned in the row direction are connected to the same second bit line BL21, so that one second bit line is shared by memory cells that are adjacent in the row direction. Furthermore, all of the second bit lines are connected directly to the pre-charging power supply line V1 in the second voltage applying circuit 702 via the common wire BL0, so that the pre-charge voltage can be supplied to all of the second bit lines. In addition, the first bit lines are respectively connected to the pre-charge power supply line V1 via the transistor for switching in the second voltage applying circuit 702, so that the first bit line for supplying the pre-charge voltage can be selected. The structure of the first voltage applying circuit 701 is the same as that of the device 1 of the present invention according to the first embodiment, and therefore, the description thereof is not repeated. This goes also for the word line applying circuit.

In the above-described device 3 of the present invention also, as in the timing chart for the device 1 of the present invention shown in FIG. 2, all of the memory cells are pre-charged to the same pre-charge voltage $V_{PRE}$ in advance, the transistor for switching in the first voltage applying circuit 701 connected to the first bit line to which the memory cell to be written is connected is turned off when the writing voltage pulse is applied, only the transistor for switching in the second voltage applying circuit 702 connected to the first bit line to which the memory cell to be written is connected is turned on, and the writing voltage pulse is applied, so that the writing operation can be carried out while avoiding writing disturbance.

(2) Although in the above-described first embodiment, the second bit lines are connected directly to the pre-charge power supply line V1 in the second voltage applying circuit without passing through the transistors for switching, transistors for switching may be provided between the respective second bit lines and pre-charge power supply line so that the second bit lines and the pre-charge power supply line are connected via the transistors. As in the first embodiment, a writing operation can be carried out while avoiding writing disturbance by using the transistors in an on state. Furthermore, the memory cell on which a pre-charge operation is to be carried out can be selected by providing a structure that allows a second bit line for applying a pre-charge voltage to be selected based on a switching signal. In this case, a pre-charge voltage may be applied only to the second bit line connected to the selected memory cell and the first bit line to which the memory cell connected to the second bit line is connected via the transistor for switching during the writing operation for the selected memory cell. As for other, unselected memory cells which are not connected to the second bit line for the selected memory cell, the transistors for switching the first bit lines and the second bit lines to which the unselected memory cells are connected may be turned off so that no voltage can be applied from the pre-charge power supply line V1 and the writing power supply line V2 through the two. As a result, only the memory cells which require a pre-charge operation can be selected so that a pre-charge voltage can be applied, and thus, the power consumption of the driving circuit for supplying a pre-charge voltage can be reduced.

(3) Although a pulse voltage for writing is supplied from the writing power supply lines V1, V3 and V4 in the first and second embodiments, a certain writing voltage can be supplied to the writing power supply line so that a pulse signal is supplied to the transistor for switching connected to the selected bit line, and thus the writing voltage pulse may be supplied to the selected bit line. In the writing timing chart in FIG. 2, for example, a constant voltage $V_{SET}$ or a reset voltage $V_{RST}$ is continuously supplied to the writing power supply line V2, so that the writing voltage pulse can be applied to the selected bit line BL11 by turning on the transistor for switching when φ21 is raised only at time t5 to t6.

The present invention can be applied to semiconductor memory devices, and in particular, used for nonvolatile memories in electronic apparatuses that require a high level of reliability in writing, such as cellular phones and digital cameras.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device, comprising:
a memory cell array formed of a number of memory cells aligned in a matrix shape in a row direction and a column direction, each memory cell comprising a memory element and a cell transistor, wherein the memory element has two input/output terminals so that information is stored using a difference in electrical properties between the two terminals and the stored information is written by applying a writing voltage across the two terminals, the cell transistor has two input/output terminals and one control terminal, and a first end of the input/output terminal of the memory element and a first end of the input/output terminal of the cell transistor are connected;
word lines extending in the row direction for connecting control terminals of the cell transistors in the memory cells aligned in same rows to each other;
first bit lines extending in the column direction for connecting second ends of the input/output terminals of the cell transistors in the memory cells aligned in same columns to each other, the second end being not connected to the memory elements;
second bit lines extending in the row or column direction for connecting second ends of the input/output terminals of the memory elements in the memory cells to each other, the second ends being not connected to the cell transistors;
a word line voltage applying circuit for applying a voltage to a word line connected to the memory cell selected to be written;
a first voltage applying circuit for applying the writing voltage to the first bit line connected to the selected memory cell; and
a second voltage applying circuit for applying a pre-charge voltage to both the first bit line and the second bit line connected to the selected memory cell before application of the writing voltage.

2. The semiconductor memory device according to claim 1, wherein the second bit lines extend in the column direction.

3. The semiconductor memory device according to claim 1, wherein
in the memory cell array, two adjacent rows of memory cells share one second bit line in a case where the second bit lines extend in the row direction, and two adjacent columns of memory cells share one second bit line in a case where the second bit lines extend in the column direction.

4. The semiconductor memory device according to claim 1, wherein
the second voltage applying circuit has a pre-charge power supply line to which the pre-charge voltage is applied, and
the pre-charge power supply line is directly connected to each of the second bit lines and connected to each of the first bit lines via a first transistor.

5. The semiconductor memory device according to claim 1, wherein
the first voltage applying circuit has a writing power supply line to which the writing voltage is applied, and
the writing power supply line is connected to each of the first bit lines via a second transistor.

6. The semiconductor memory device according to claim 1, wherein
the first voltage applying circuit has a first writing power supply line and a second writing power supply line to which the writing voltages different from the pre-charge voltage are applied, respectively.

7. The semiconductor memory device according to claim 6, wherein
the first writing power supply line is connected to each of the first bit lines via a third transistor, and
the second writing power supply line is connected to each of the first bit lines via a fourth transistor.

8. The semiconductor memory device according to claim 6, wherein
the pre-charge voltage is a voltage between one of the writing voltages applied to the first writing power supply line and the other one of the writing voltages applied to the second writing power supply line.

9. The semiconductor memory device according to claim 2, wherein
the second voltage applying circuit has a pre-charge power supply line to which the pre-charge voltage is applied, and
the pre-charge power supply line is directly connected to each of the second bit lines and connected to each of the first bit lines via a first transistor.

10. The semiconductor memory device according to claim 2, wherein
the first voltage applying circuit has a writing power supply line to which the writing voltage is applied, and
the writing power supply line is connected to each of the first bit lines via a second transistor.

11. The semiconductor memory device according to claim 2, wherein
the first voltage applying circuit has a first writing power supply line and a second writing power supply line to which the writing voltages different from the pre-charge voltage are applied, respectively.

12. The semiconductor memory device according to claim 11, wherein
the first writing power supply line is connected to each of the first bit lines via a third transistor, and
the second writing power supply line is connected to each of the first bit lines via a fourth transistor.

13. The semiconductor memory device according to claim 11, wherein
the pre-charge voltage is a voltage between one of the writing voltages applied to the first writing power supply line and the other one of the writing voltages applied to the second writing power supply line.

14. The semiconductor memory device according to claim 1, wherein
the memory elements are variable resistive elements of which a resistance state represented by resistance properties between the two input/output terminals of the memory elements transitions through the application of the writing voltage.

15. An electronic apparatus comprising the semiconductor memory device according to claim 1.

* * * * *